US011616217B2

(12) United States Patent
Jo et al.

(10) Patent No.: US 11,616,217 B2
(45) Date of Patent: Mar. 28, 2023

(54) DISPLAY PANEL AND MANUFACTURING METHOD THEREOF

(71) Applicant: SAMSUNG DISPLAY CO., LTD., Yongin-si (KR)

(72) Inventors: Wonje Jo, Yongin-si (KR); Youngji Kim, Yongin-si (KR); Yiseul Um, Yongin-si (KR); Younghoon Lee, Yongin-si (KR); Youngseo Choi, Yongin-si (KR); Dongwon Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 188 days.

(21) Appl. No.: 16/719,334

(22) Filed: Dec. 18, 2019

(65) Prior Publication Data

US 2020/0266395 A1    Aug. 20, 2020

(30) Foreign Application Priority Data

Feb. 18, 2019   (KR) ........................ 10-2019-0018816

(51) Int. Cl.
*H01L 27/32* (2006.01)
*H01L 51/56* (2006.01)
*H01L 51/52* (2006.01)
*H01L 51/00* (2006.01)

(52) U.S. Cl.
CPC .......... *H01L 51/56* (2013.01); *H01L 27/3276* (2013.01); *H01L 51/0096* (2013.01); *H01L 51/5253* (2013.01)

(58) Field of Classification Search
CPC . H01L 51/56; H01L 51/0096; H01L 27/3244; H01L 2227/323; H01L 2251/566; H01L 27/32; Y02E 10/549; B26D 3/065; B25J 9/1664; B25J 9/1697; Y02P 70/50
See application file for complete search history.

(56) References Cited

U.S. PATENT DOCUMENTS

| | | | |
|---|---|---|---|
| 8,721,389 B2 | 5/2014 | Jung et al. | |
| 8,721,392 B2 | 5/2014 | Brown et al. | |
| 8,854,591 B2 | 10/2014 | Liu et al. | |
| 9,011,623 B2 | 4/2015 | Kenney et al. | |
| 9,474,125 B2 | 10/2016 | Kim et al. | |
| 9,720,268 B2 | 8/2017 | Liu et al. | |
| 9,896,372 B2 | 2/2018 | Vogt et al. | |

(Continued)

FOREIGN PATENT DOCUMENTS

| | | | | |
|---|---|---|---|---|
| EP | 1755156 A2 * | 2/2007 | ........ | H01L 21/6708 |
| KR | 10-0812002 | 3/2008 | | |
| KR | 10-2018-0025383 | 3/2018 | | |

*Primary Examiner* — Caridad Everhart
(74) *Attorney, Agent, or Firm* — F. Chau & Associates, LLC

(57) ABSTRACT

A method of manufacturing a display panel includes forming a unit panel which includes a display unit provided on a substrate. The substrate of the unit panel is cut out in a form of a closed loop having a straight line portion and a curve portion that are connected to each other. The cutting out of the substrate of the unit panel includes cutting the straight line portion by a first cutting process using a first tool and cutting the curve portion by a second cutting process using a second tool that is different from the first tool.

19 Claims, 7 Drawing Sheets

(56) References Cited

U.S. PATENT DOCUMENTS

| | | | |
|---|---|---|---|
| 2009/0169792 A1* | 7/2009 | Ryou | H04M 1/0202 |
| | | | 428/38 |
| 2013/0234193 A1* | 9/2013 | Odnoblyudov | H01L 33/0095 |
| | | | 257/99 |
| 2015/0061079 A1* | 3/2015 | Chen | H01L 21/78 |
| | | | 257/620 |
| 2015/0261261 A1* | 9/2015 | Bhagavatula | G06K 9/00053 |
| | | | 361/679.56 |
| 2017/0084879 A1* | 3/2017 | Wen | H01L 51/56 |
| 2018/0059454 A1 | 3/2018 | Shin et al. | |
| 2018/0101711 A1* | 4/2018 | D'Souza | G06K 9/228 |
| 2018/0151663 A1* | 5/2018 | Kim | H01L 27/3223 |
| 2018/0158417 A1* | 6/2018 | Xiang | G09G 3/3233 |
| 2018/0371315 A1* | 12/2018 | Hofmann | H01L 33/50 |
| 2019/0181387 A1* | 6/2019 | Go | H01L 51/56 |
| 2020/0176538 A1* | 6/2020 | Um | H01L 27/3272 |
| 2020/0176583 A1* | 6/2020 | Wostyn | H01L 21/823807 |
| 2021/0074876 A1* | 3/2021 | Kishimoto | H01L 33/0093 |
| 2021/0367199 A1* | 11/2021 | Li | H01L 51/56 |

\* cited by examiner

DISPLAY PANEL AND MANUFACTURING METHOD THEREOF

CROSS-REFERENCE TO RELATED APPLICATION

This application claims priority under 35 U.S.C. § 119 to Korean Patent Application No. 10-2019-0018816, filed on Feb. 18, 2019, in the Korean Intellectual Property Office, the disclosure of which is incorporated by reference in its entirety herein.

TECHNICAL FIELD

The present disclosure relates to a display panel and a method of manufacturing the display panel in which a unit panel is cut out in a desired shape.

DISCUSSION OF RELATED ART

Generally, a process of manufacturing a display panel may include forming a unit panel, such as a single board panel, in which a display is provided substantially in a center of a substrate. The outer periphery of the substrate surrounding the display may be cut to provide a desired shape for the panel. However, the cutting process may require the cutting of both curved portions and straight portions which have different requirements for precise cutting thereof. Furthermore, the curved and straight portions of the display may require polishing to prevent cut portions having a decreased strength from remaining on the display. Polishing of the curved portions and straight portions may involve excessive polishing which causes decreased productivity and work efficiency as well as a reduction of the usage life of the polishing tool(s).

SUMMARY

One or more exemplary embodiments include a display panel and a method of manufacturing the display panel, whereby work efficiency may be improved by reducing abrasion and increasing a usage life of a tool in a process of cutting out a unit panel into a desired display panel shape, and particularly, the display panel may be used for cutting out a single board panel in which a display unit on a substrate is covered with a thin film encapsulation layer.

Additional aspects will be set forth in part in the description which follows and, in part, will be apparent from the description, or may be learned by practice of the presented exemplary embodiments.

According to one or more exemplary embodiments, a method of manufacturing a display panel includes forming a unit panel which includes a display unit provided on a substrate. The substrate of the unit panel is cut out in a form of a closed loop having a straight line portion and a curve portion that are connected to each other. The cutting out of the substrate of the unit panel includes: cutting the straight line portion by a first cutting process using a first tool; and cutting the curve portion by a second cutting process using a second tool that is different from the first tool.

The first cutting process may include cutting off the straight line portion by using a cutting wheel.

The second cutting process may include cutting off the curve portion by using a laser.

The method may further include a first polishing process of polishing an edge of a cut end of the straight line portion.

The first polishing process may include polishing, by using a first polishing tool, at least one of an upper edge at which the display is located and a lower edge that is opposite to the upper edge.

The straight line portion may include a pad-adjacent straight line portion that is adjacent to a pad for connecting wirings and a pad-apart straight line portion that is apart from the pad, wherein the upper edge and the lower edge of the pad-apart straight line are consecutively polished by using the first polishing tool, and the pad-adjacent straight line is polished in a mode selected from among a first mode in which the upper edge and the lower edge are consecutively polished, a second mode in which only the lower edge is polished, and a third mode in which none of the upper edge and the lower edge is polished.

The method may further include a second polishing process of polishing an edge of a cut end of the curve portion.

The second polishing process may include simultaneously polishing, by using a second polishing tool, the upper edge at which the display is located and the lower edge that is opposite to the upper edge.

The substrate may include glass.

The display unit may include a thin film encapsulation layer that covers the display unit.

The thin film encapsulation layer may include at least one organic film and at least one inorganic film.

The display unit may include a thin film transistor and a light-emitting device.

According to one or more exemplary embodiments, a display panel includes a substrate having an outer periphery that includes a straight line portion and a curve portion that are connected to each other. A display unit is provided on the substrate. The display panel has a step at a boundary at which the straight line portion and the curve portion are connected to each other.

A height of the step may be from about 90 μm to about 200 μm.

An upper edge at which the display unit is located and a lower edge opposite to the upper edge may be both polished in the curve portion.

The straight line portion may include a pad-adjacent straight line portion that is adjacent to a pad for connecting wirings and a pad-apart straight line portion that is apart from the pad.

An upper edge at which the display panel is located and a lower edge opposite to the upper edge are both polished in the pad-apart straight portion.

The pad-adjacent straight line portion may include a structure from among a first polished structure in which the upper edge at which the display is located and the lower edge are both polished, a second polished structure in which only the lower edge is polished, and a third polished structure in which neither of the upper edge and the lower edge is polished.

The substrate may include glass.

The display panel may include a thin film encapsulation layer that covers the display unit. The thin film encapsulation layer may include at least one organic film and at least one inorganic film.

The display may include a thin film transistor and a light-emitting device.

Aspects and features other than the descriptions will be apparent from the attached drawings, claims, and detailed descriptions.

According to one or more exemplary embodiments, a method of manufacturing a display panel includes forming a unit panel in which a display unit and an outer margin area are provided. The substrate is cut out of the unit panel in a form of a closed loop having a straight line portion and a curve portion that are connected to each other. A first amount is simultaneously polished of the curve portion of an upper edge having the display thereon and the lower edge opposite to the upper edge by a second polishing process using a second polishing tool. A second amount is polished of the straight portion of an upper edge and a lower edge opposite to the upper edge by a first polishing process using a first polishing tool. The first amount is larger than the second amount and a step is formed at a boundary at which the straight light portion and the curve portion are connected to each other.

BRIEF DESCRIPTION OF THE DRAWINGS

These and/or other aspects will become apparent and more readily appreciated from the following description of the exemplary embodiments of the present inventive concepts, taken in conjunction with the accompanying drawings in which.

DETAILED DESCRIPTION OF THE EXEMPLARY EMBODIMENTS

Figure 1:
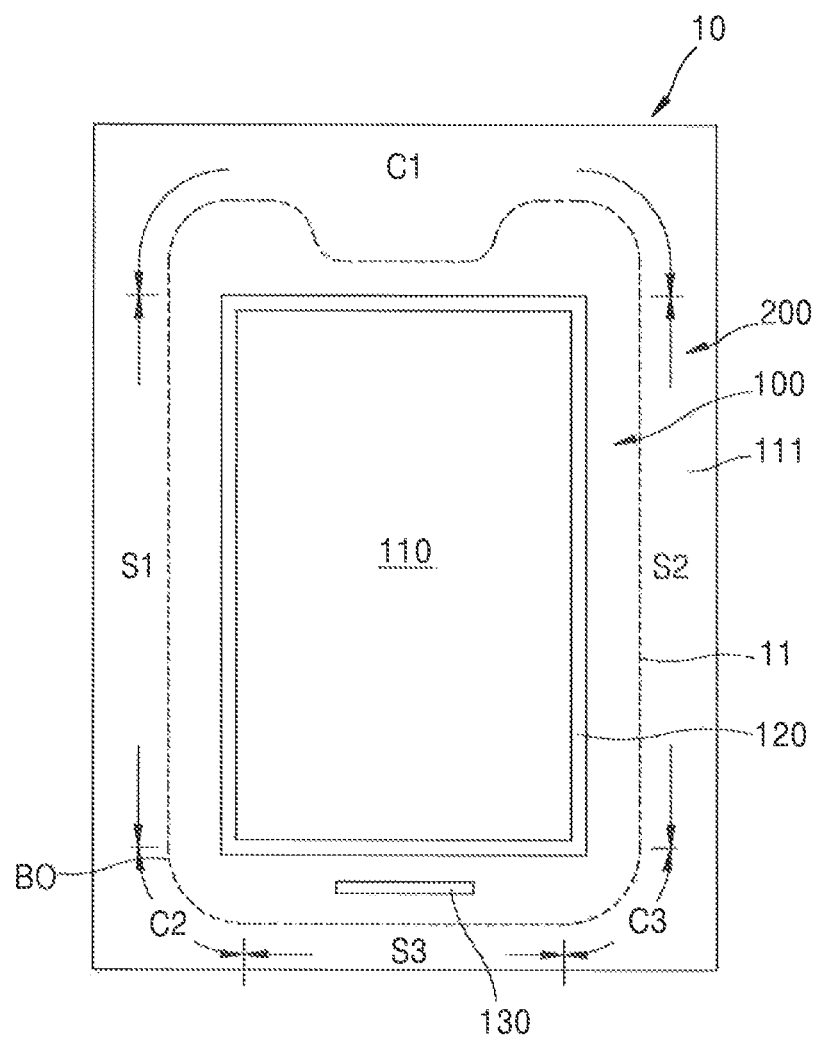
FIG. 1 is a top-plan view of a unit panel which includes a panel area and an outer margin area according to an exemplary embodiment of the present inventive concepts.

While particular exemplary embodiments of the present inventive concepts will be illustrated in the drawings and described in detail herein, the present disclosure allows for various changes and numerous other embodiments. For example, features of the present disclosure and achieving the same may become apparent with reference to exemplary embodiments described in detail hereinafter and the drawings. The present disclosure is not limited to the exemplary embodiments set forth herein and may be embodied in various forms.

Hereinafter, exemplary embodiments of the present inventive concepts will be described in detail with reference to the attached drawings. Like reference numerals in the drawings denote like elements, and repeated descriptions thereof will be omitted.

An expression used in the singular encompasses the expression of the plural, unless it has a clearly different meaning in the context.

In the exemplary embodiments, it is to be understood that the terms such as "including," "having" are intended to indicate the existence of the features or components disclosed in the specification, and are not intended to preclude the possibility that one or more other features or components may exist or may be added.

In the drawings, sizes of the components may be exaggerated for convenience of explanation. Since the sizes and thicknesses of components in the drawings may be arbitrarily illustrated for convenience of explanation, the present disclosure is not limited thereto.

Embodiments of the present inventive concepts may be implemented differently than described with respect to the exemplary embodiments. For example, a specific process order may be performed differently from the described order. Additionally, two consecutively described processes may be performed substantially at the same time or performed in an order opposite to the described order.

FIG. 1 is a top-plan view showing a unit panel 10 including an outer margin area 200 and a panel area 100 prior to the panel area being cut to form a display panel having a desired shape.

As shown in FIG. 1, in the unit panel 10, a substrate 111 may include a panel area 100 having a display unit 110 and an outer margin area 200 surrounding the panel area 100. In an exemplary embodiment, the substrate 111 may be composed of glass. As shown in the exemplary embodiment shown in FIG. 5, the display unit 110 may be covered and protected by a thin film encapsulation layer 120 in which an organic film 122 and inorganic films 121 and 123 are alternately stacked. However, in certain embodiments, the display unit 110 may not include a thin film encapsulation layer 120. The outer margin area 200 may be removed by cutting the substrate 111 along a cutting line 11 (e.g., a marked broken line, etc.) disposed between the panel area 100 and the outer margin area 200. In an exemplary embodiment, the panel area 100 may be positioned substantially in a middle portion of the unit panel 10. However, in certain embodiments, the panel area 100 may not be disposed substantially in the middle portion of the unit panel 10. For example, the panel area 100 may have one or more edges disposed substantially along a side of the unit panel 10. The removal of the outer margin area 200 by a cutting process results in the formation of a display panel of a desired shape having the display unit 110 thereon. The panel area 100 may include a pad 130 disposed outside of the display unit 110 for the connection of wirings to the display unit.

Figure 2:
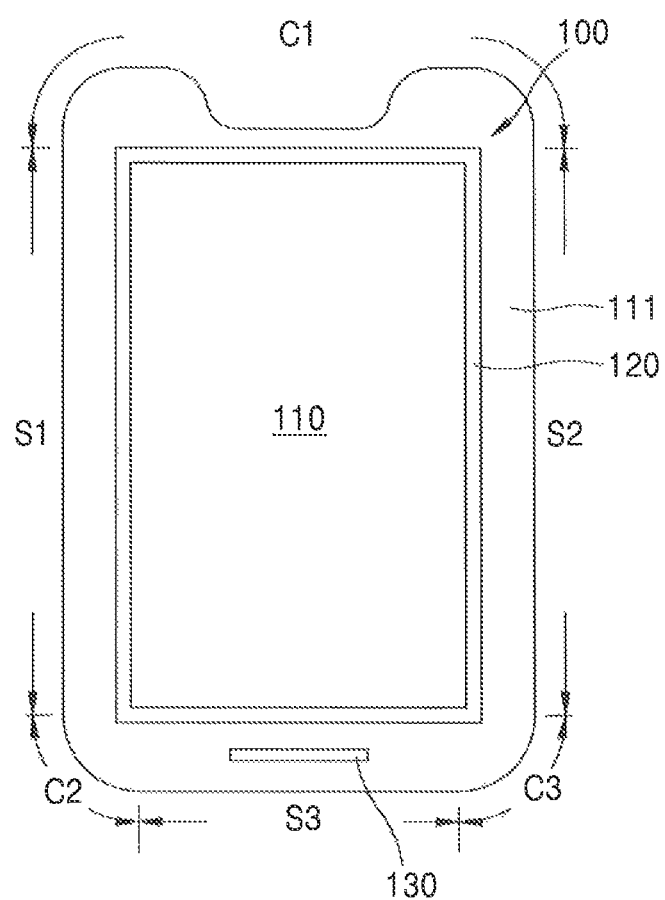
FIG. 2 is a top-plan view of the unit panel of FIG. 1 after the unit panel is cut and the outer margin is removed according to an exemplary embodiment of the present inventive concepts.

FIG. 2 shows the display panel after a cutting process in which the outer margin area 200 is removed and only the panel area 100 remains on the substrate 111. As shown in FIG. 2, an outer shape of the display panel may have the form of a closed loop. The closed loop may include at least one straight line portion and at least one curved portion. For example, the closed loop shown in FIG. 2 includes a plurality of straight line portions S1, S2, and S3 connected to a plurality of curve portions C1, C2, and C3. The straight line portions S1, S2, and S3 may have relatively simple shapes which may be easily cut and polished. In contrast, the curve portions C1, C2, and C3 may have relatively complicated shapes that require more precise cutting and polishing. In the present exemplary embodiment, the cutting and polishing of the straight line portions S1, S2, and S3 and the curve portions C1, C2, and C3 may be performed by using different tools and processes for such portions. The straight line portions S1, S2, and S3 and the curve portions C1, C2, and C3 may be cut out by using different tools and processes for cutting and polishing that are configured for the specific characteristics of the straight line portions S1, S2, and S3 and the curve portions C1, C2, and C3.

A cutting out process in which different tools are used according to sections will be described in detail later.

An internal structure of a pixel of the display unit 110 is briefly described with reference to FIG. 5.

Figure 5:
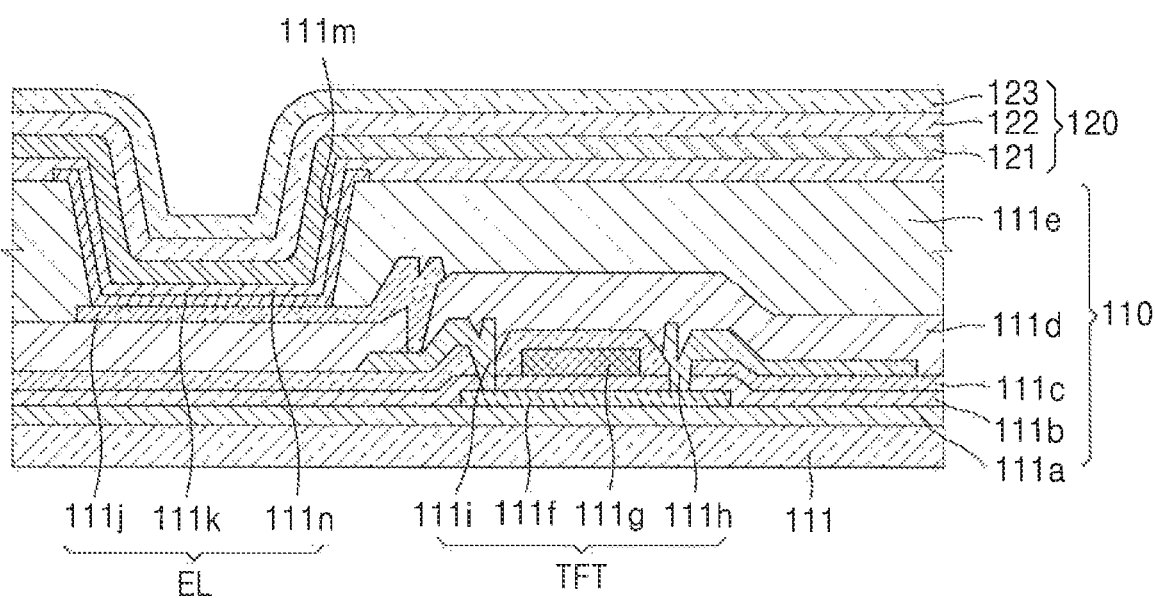
FIG. 5 is a cross-sectional view showing a structure of a pixel of a display unit shown in FIG. 1 according to an exemplary embodiment of the present inventive concepts.

As shown in FIG. 5, the display unit 110 may include a plurality of pixels each having a structure in which a thin film transistor TFT and a light-emitting device EL are stacked on the substrate 111. An active layer 111f may be formed on a buffer layer 111a on the substrate 111. The active layer 111f may have a source area and drain area doped with an N-type or P-type impurity of a high concentration. The active layer 111f may include an oxide semiconductor. For example, in one exemplary embodiment, the oxide semiconductor may include Group 12, Group 13, and Group 14 metal elements, such as zinc (Zn), indium (In), gallium (Ga), tin (Sn), cadmium (Cd), germanium (Ge) or combinations thereof. For example, the active layer 111f may include G-I-Z-O[$(In_2O_3)a(Ga_2O_3)b(ZnO)c$] in which a, b, and c are real numbers and $a \geq 0$, $b \geq 0$, and $c > 0$. A gate electrode 111g may be formed above the active layer 111f with a gate insulating layer 111b disposed therebetween. A source electrode 111h and a drain electrode 111i may be formed on the gate electrode 111g. An interlayer insulating layer 111c may be provided between the gate electrode 111g, the source electrode 111h, and the drain electrode 111i. A passivation layer 111d may be disposed between the source electrode 111h, the drain electrode 111i, and an anode electrode 111j of the light-emitting device EL.

An insulating polarization layer 111e including acryl and the like may be formed on the anode electrode 111j. An opening 111m may be formed in the insulating polarization layer 111e in which the light-emitting device EL is formed.

The light-emitting device EL displays image data by emitting red, blue, and green light according to flow of a current. The light-emitting device EL may include the anode electrode 111j that may be connected to the drain electrode 111i of the thin film transistor TFT and receives positive power from the drain electrode 111i. The light-emitting device may also include a cathode electrode 111n covering the entire pixels which provides negative power. The light-emitting device EL may also include an emission layer 111k which emits light and is disposed between the anode electrode 111j and the cathode electrode 111n.

A hole injection layer (HIL), a hole transport layer (HTL), an electron transport layer (ETL), an electron injection layer (EIL), and the like may be stacked adjacent to the emission layer 111k.

The emission layer 111k may be separately formed in each pixel such that pixels emitting red, green, blue lights collectively form one unit pixel. Alternatively, the emission layer 111k may be formed in common over an entire pixel area, regardless of positions of the pixels. In this embodiment, the emission layer 111k may be formed by vertically stacking or mixing a plurality of layers including emission materials that emit red, green, and blue lights. Any combination of other colors, which is capable of emitting white light, may be employed to a combination of red, green, and blue colors. In addition, the emission layer 111k may further include a color conversion layer, which converts the white light into a color. The emission layer 111k may also include a color filter.

As the emission layer 111k is very vulnerable to moisture, a thin film encapsulation layer 120 may be formed on the cathode electrode 111n to protect the emission layer 111k. The thin film encapsulation layer 120 may include at least one organic film and at least one inorganic film. For example, in the exemplary embodiment shown in FIG. 5, the thin film encapsulation layer 120 includes an organic film 122 and inorganic films 121 and 123 that are alternately stacked.

The cutting out and polishing processes of the panel area 100 that includes the display unit 110 from the unit panel 10 may be performed as shown in FIGS. 3A through 3E.

The unit panel 10 having a panel area 100 that includes a display unit 100 and an outer margin area 200 may be prepared. The straight line portions S1, S2, and S3 may be cut by a first cutting process. For example, in an exemplary embodiment shown in FIG. 3A, the straight line portions S1, S2, S3 are cut using a cutting wheel 311. The first cutting process may be performed by generally moving the cutting wheel 311 along the cutting line 11 of the straight line portions S1, S2, and S3.

The curve portions C1, C2, and C3 may be cut by a second cutting process using a tool that is different from the tool used in the first cutting process. In an exemplary embodiment, the second cutting process may be performed by a laser processing method using an infrared pico laser 321. The infrared pico laser is configured to perform precise cutting for the curve portions C1, C2. C3. However, the relatively simple shapes of the straight line portions S1, S2 and S3 may not require such a precise cutting method.

After the first and second cutting processes are performed the straight line portions S1, S2, and S3 and the curve portions C1, C2, and C3 are cut and the outer margin area 200 may be removed from the unit panel 10. Therefore, as shown in the exemplary embodiment of FIG. 2, only the panel area 100 may remain after the first and second cutting processes are performed.

The cut surfaces of the panel area 100 in this state may have rough edges and proper polishing and smoothing may be required to remove damaged portions having a decreased strength.

Figure 3A:
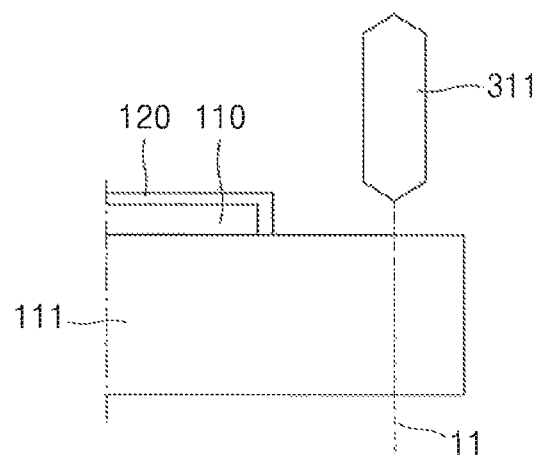
FIGS. 3A and 3B are cross-sectional views showing a process of cutting out the unit panel shown in FIG. 1 along a cutting line according to exemplary embodiments of the present inventive concepts.
Figure 3B:
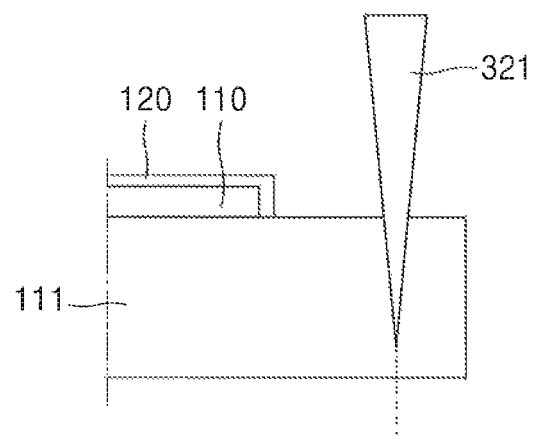
Figure 3C:
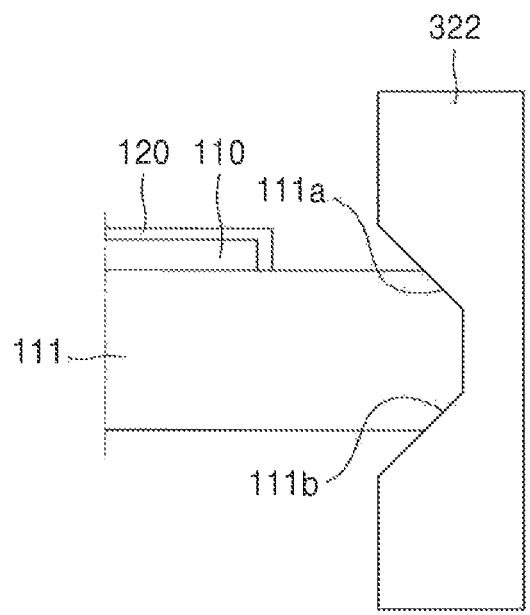
FIGS. 3C, 3D and 3E are cross-sectional views showing a process of polishing the unit panel after the unit panel is cut and the outer margin area has been removed according to exemplary embodiments of the present inventive concepts.

A second polishing process may be performed on edge portions of the panel area. For example, as shown in FIG. 3C a second polishing process may be performed on an upper edge 111a and lower edge 111b of the curve portions C1, C2, and C3 of the panel area 100. The upper and lower edges 111a, 111b may be oriented relative to the depth dimension of the substrate. The upper edge 111a may be the edge at which the display unit 110 is located. The lower edge 111b is opposite the upper edge 111a.

In an exemplary embodiment, the upper and lower edges 111a, 111b may be simultaneously polished in the second polishing process by using a second polishing tool 322. The second polishing tool 322 may be configured to move along the curve portions C1, C2, and C3 and pass the upper edges 111a and the lower edges 111b at the cut surface of the substrate 111 while simultaneously polishing the upper edge 111a and the lower edge 111b. Since the second polishing tool 322 has to follow the relatively complicated shapes of the curve portions C1, C2, and C3, the second polishing process may be performed by a computerized numeral control (CNC) process which is highly precise and the second polishing tool may be a CNC machine. In an exemplary embodiment, in the CNC process, the amounts of polishing of the upper edge 111a and the lower edge 111b of the curved portions may each be from about 150 μm to about 200 μm. The amount of polishing of the curved portions C1, C2, C3 may be relatively larger than an amount of polishing of the straight line portions S1, S2, and S3. For example, the second polishing tool 322 may polish the curve portions C1, C2, and C3 having complicated shapes precisely by using the CNC processing method. In an exemplary embodiment, the second polishing tool 322 may simultaneously polish the upper edge 111a and the lower edge 111b to provide a method with improved time efficiency. However, as the second polishing tool 322 polishes a cut end of the substrate 111 by almost covering the cut end while passing therethrough, the amount of polishing is increased correspondingly.

A first polishing process may be performed on end edges of the straight line portions S1, S2, and S3. The first polishing process may be different than the second polishing process. For example, in an exemplary embodiment, the first polishing process utilizes a first polishing tool 312 that is a grinding tool. The first polishing process may include separately polishing the upper and lower edges of the straight line portions S1, S2, S3 using the first polishing tool 312.

Figure 3D:
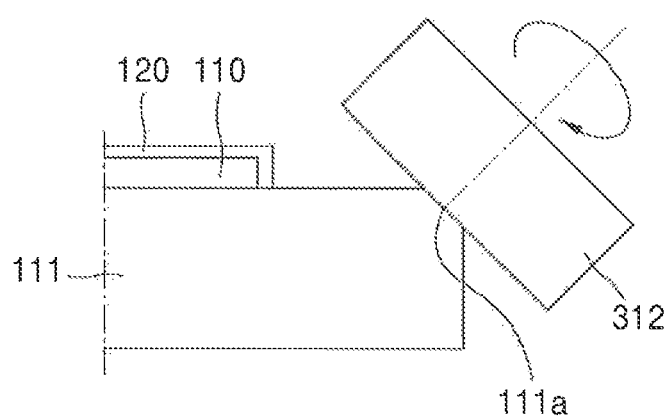
Figure 3E:
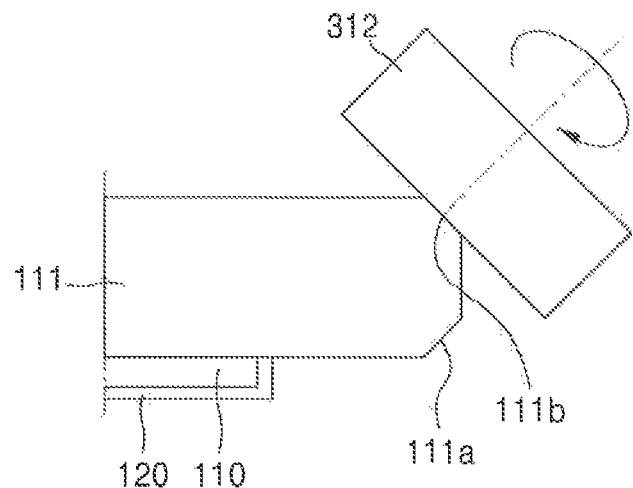

For example, as shown in FIG. 3D, the first polishing tool 312 may be moved along the upper edge 111a of the substrate 111 to polish the upper edge of the straight line portions S1, S2, S3. In a separate step shown in FIG. 3E, the grinding tool 312 may be moved along the lower edge 111b of the substrate 111 to polish the lower edge of the straight line portions S1, S2, S3. The polishing is performed along the straight line portions S1, S2, and S3 having simple straight line shapes. Therefore, polishing may be performed by bringing the first polishing tool 312 into a slight contact with the upper edge 111a and the lower edge 111b. The amount of polishing of each of the upper edge 111a and the lower edge 111b may be from about 5 μm to about 60 μm. The amount of polishing of the upper edge and the lower edge of the straight line portions using the first polishing process and the first polishing tool may be less than the amount of the polishing of the curve portions C1, C2, and C3 performed by the second polishing process using the second polishing tool 322.

The upper edge 111a and the lower edge 111b of the curve portions C1, C2, and C3 having complicated shapes may be simultaneously polished by performing the second polishing process using the second polishing tool 322 to quickly and precisely perform the polishing process even if the amount of polishing increases. In contrast, the straight line portions S1, S2, and S3, which have relatively simple shapes may be polished by the first polishing process using the first polishing tool 312 to reduce the amount of polishing as compared to the second polishing process. Therefore, the method permits the curve shapes C1, C2, and C3 having complicated shapes to be quickly and precisely polished while reducing abrasion of the second polishing tools by using the first polishing tool to polish the straight lines S1, S2, S3. The use of separate polishing process and separate polishing tools to polish the straight lines S1, S2 and S3 and the curve shapes C1, C2 and C3 results in the reduction of abrasion of the first polishing tool 312 and the second polishing tool 322 and increases the usage lives thereof. The increase in the usage lives of the first polishing tool 312 and the second polishing tool 322 results in a decrease in the number of replacements needed for the polishing tools, and an increase in the work efficiency.

Figure 4:
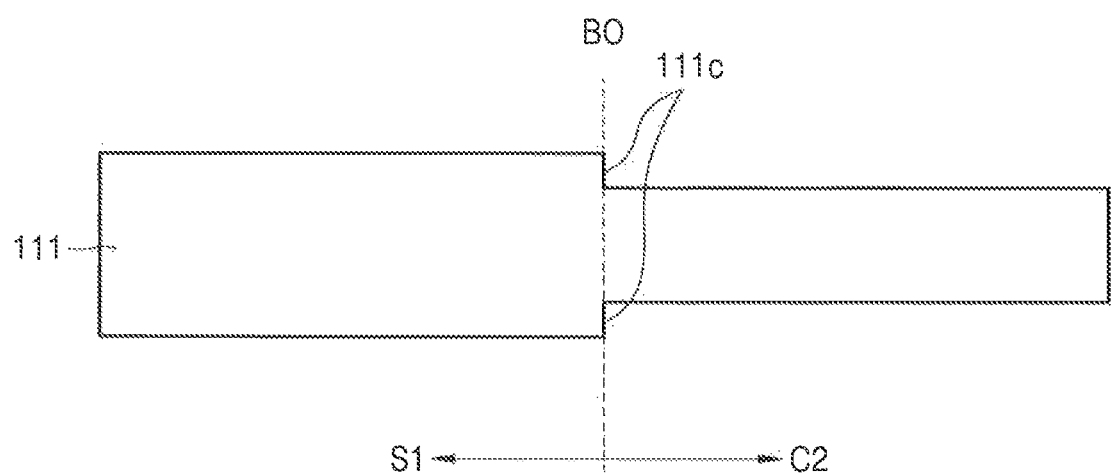
FIG. 4 is a cross-sectional view showing the formation of a step at a boundary between a straight line portion and a curve portion of the unit panel according to an exemplary embodiment of the present inventive concepts.

Since the straight line portions S1, S2, and S3 and the curve portions C1, C2, and C3 have different tools for cutting and polishing, the amounts of polishing of the straight line portions S1, S2, and S3 may be different from those of the curve portions C1, C2, and C3. For example, the amounts of polishing in the straight line portions S1, S2, and S3 may be comparatively small and the amounts of polishing in the curve portions C1, C2, and C3 may be larger. The different amounts of polishing performed in the first and second polishing processes may lead to the formation of a step 111c at each of the boundaries BO at which the straight line portions S1, S2, and S3 meet the curve portions C1, C2, and C3. FIG. 4 shows an example of the boundary BO at which the straight line portion S1 and the curve portion C2 meet each other.

In an exemplary embodiment, a height of the step 111c may be from about 90 μm to about 200 μm. The maximum height of the step 111c may be about 200 μm because the straight line portion S3 adjacent to the pad 130 from among the straight line portion S1, S2, S3 may not be polished. This modified embodiment will be described later.

Therefore, by cutting out the panel area 100 from the unit panel 10 in the above-mentioned method, the straight line portions S1, S2, and S3 and the curve portions C1, C2, and C3 of the substrate 111 may be respectively cut out in a manner which provides precise and quick polishing for each of the areas and reduces abrasion of the first polishing tool 312 and the second polishing tool 322.

In addition, the above-mentioned cutting out method may be particularly useful for cutting out a single board panel in which the display unit 110 is provided on the substrate 111 formed of glass and the thin film encapsulation layer 120 covers the display unit 110. For example, in a laminated panel in which the display unit 110 is covered by a glass substrate like the substrate 111 instead of the thin film encapsulation layer 120, a gap between the display unit 110 and the glass substrate may be sealed by using a sealant. When the curve portions C1, C2, and C3 are polished by using the first polishing tool 312, polishing sludge may be concentrated at a center portion that is a boundary between an upper glass substrate and a lower glass substrate. Therefore, a gap may be formed between the upper glass substrate and the lower glass substrate due to stress. However, in the single board panel, only the substrate 111, which is a single substrate, may be cut and polished. Therefore, an error such as the gap between substrates may not occur, and thus, the single board panel may be easily employed.

Figure 6:
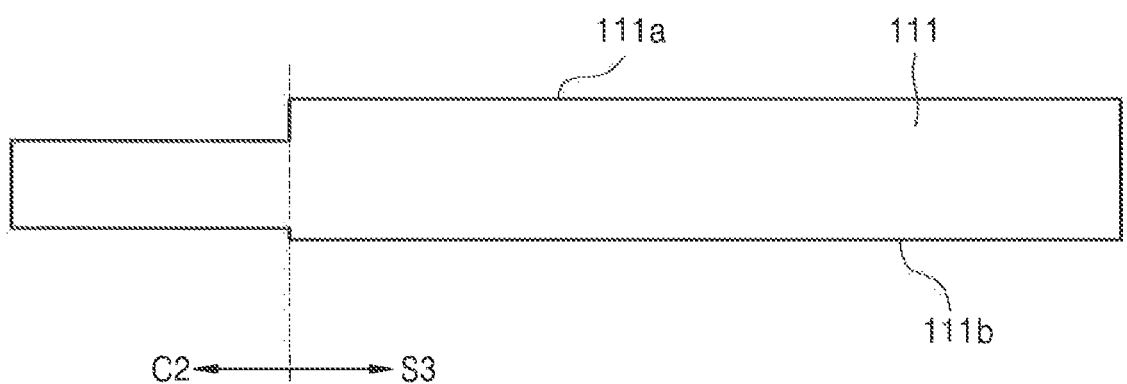
FIGS. 6 and 7 are cross-sectional views showing the formation of a step according to exemplary embodiments of the present inventive concepts.
Figure 7:
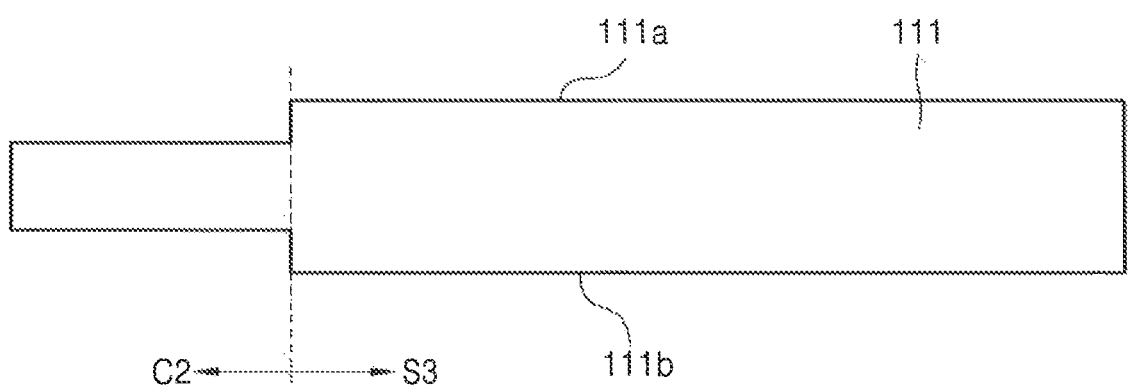

FIGS. 6-7 show exemplary embodiments in which the plurality of straight line portions S1, S2, and S3 may be commonly polished, but the straight line portion S3 adjacent to the pad 130 may not be polished. From among the plurality of straight line portions S1, S2, and S3, the straight line portion S3 adjacent to the pad 130 may be referred to as a pad-adjacent straight line portion and the straight line portions S1 and S2 may be referred to as pad-apart straight line portions. In each of the pad-apart straight line portions S1 and S2, both the upper edge 111a and the lower edge 111b may be polished. However, as shown in the exemplary embodiment of FIG. 6, only the lower edge 111b may be polished in the pad-adjacent straight line portion S3 and the upper edge 111a remains unpolished.

Alternatively, as shown in the exemplary embodiment of FIG. 7, both the upper edge 111a and the lower edge 111b may not be polished for the pad-adjacent straight line portions S3. Since the pad 130 is a portion connected to a plurality of wirings, the wirings may be harmed while polishing. Therefore, the first polishing process may omit the polishing of the pad-adjacent straight line S3 portions. The first polishing process may omit polishing the entire pad-adjacent straight line S3 portion or just the regions of the pad-adjacent straight line portion proximate to the pad 130. As the pad 130 is provided at the upper surface of the substrate 111, only the lower edge 111b may be polished as shown in FIG. 6, or alternatively, polishing of the pad-adjacent straight line portion S3 may be omitted. Accordingly, in the present exemplary embodiment, the straight line portions S1, S2, and S3 and the curve portions C1, C2, and C3 included in the outer periphery of the display panel may be cut and polished using different methods, and polishing of some of the straight line portions S1, S2, and S3 may be omitted.

While the closed loop shown in the exemplary embodiment includes pad-adjacent straight line S3 portions, in other exemplary embodiments which include pad-adjacent curve portions, polishing may be omitted for at least one of the upper edge and lower edge of the pad-adjacent curve portions in addition to any pad-adjacent straight portions.

In summary, sizes of the curve portions C1, C2, and C3 may increase according to an increase in a degree of shape freedom of a unit panel, such as a single board panel. If only a method of polishing the straight line portions S1, S2, and S3 is utilized, the curve portions C1, C2, and C3 are not properly polished and damaged portions having decreased strength may remain. As a result, a strength of the apparatus may be decreased. On the other hand, when only a method of polishing the curve portions C1, C2, and C3 is used, consumption of the polishing tool may be excessively increased, and thus, productivity may be decreased. However, in the above-mentioned method, by employing different polishing methods in which amounts of polishing of the straight line portions and the curve portions that are included in the outer periphery of the display panel are different, abrasion of the polishing tools may be reduced and the usage lives of the polishing tools may be increased while precisely and quickly polishing the curve portions having complex shapes. Therefore, the work efficiency may be significantly improved. Eventually, as decrease in strength of the display panel may be prevented by removing vulnerable portions in the straight line portions and the curve portions of the single board panel by properly polishing the single board panel, the method of polishing according to the embodiments may be useful for manufacturing single board panels cut in various shapes.

Meanwhile, the first cutting process, second cutting process, first polishing process, and second polishing process are labeled with ordinal numbers to distinguish one process from another, and are not intended to limit an order of processes.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in forms and details may be made therein without departing from the spirit and scope as defined by the following claims.

What is claimed is:

1. A method of manufacturing a display panel, the method comprising:
   forming a unit panel which includes a display unit provided on a substrate the substrate comprising glass; and
   cutting out the substrate of the unit panel in a form of a closed loop having a straight line portion and a curve portion that is connected to the straight line portion,
   wherein the cutting out of the substrate of the unit panel comprises:
   cutting the straight line portion by a first cutting process using a first tool; and
   cutting the curve portion by a second cutting process using a second tool that is different from the first tool.

2. The method of claim 1, wherein the first tool is a cutting wheel.

3. The method of claim 1, wherein the second tool is a laser.

4. The method of claim 1, further comprising a first polishing process of polishing an edge of a cut end of the straight line portion.

5. The method of claim 4, wherein the first polishing process comprises polishing at least one of an upper edge at which the display unit is located and a lower edge that is opposite to the upper edge using a first polishing tool.

6. The method of claim 5, wherein the straight line portion comprises a pad-adjacent straight line portion that is adjacent to a pad for connecting wirings and a pad-apart straight line portion that is spaced apart from the pad,
   wherein the upper edge and the lower edge of the pad-apart straight line portion are consecutively polished by using the first polishing tool, and
   wherein one of the following is performed: the upper edge and the lower edge of the pad-adjacent straight line portion are consecutively polished; only the lower edge of the pad-adjacent straight line portion is polished; and the upper edge and the lower edge of the pad-adjacent straight line portion are both not polished.

7. The method of claim 1, further comprising polishing an edge of a cut end of the curve portion by a second polishing process.

8. The method of claim 7, wherein the second polishing process comprises simultaneously polishing an upper edge having the display thereon and the lower edge opposite to the upper edge using a second polishing tool.

9. The method of claim 1, wherein the display unit includes a thin film encapsulation layer that covers the display unit, the thin film encapsulation layer comprising at least one organic film and at least one inorganic film.

10. The method of claim 1, wherein the display unit comprises a thin film transistor and a light-emitting device.

11. A display panel comprising:
   a substrate including an outer periphery in a plan view having a straight line portion and a curve portion that is connected to the straight line portion, the substrate comprising glass; and
   a display unit provided on the substrate,
   wherein the display panel has a step in a thickness direction of the substrate that is positioned at a boundary at which the curve portion is connected to the straight line portion.

12. The display panel of claim 11; wherein a height of the step is from about 90 μm to about 200 μm.

13. The display panel of claim 11, wherein an upper edge at which the display is located and a lower edge opposite to the upper edge are both polished in the curve portion.

14. The display panel of claim 11, wherein:
   the substrate further includes a pad for connecting wires; and
   the straight line portion comprises a pad-adjacent straight line portion that is adjacent to the pad and a pad-apart straight line portion that is spaced apart from the pad.

15. The display panel of claim 14, wherein an upper edge at which the display panel is located and a lower edge opposite to the upper edge are both polished in the pad-apart straight line portion.

16. The display panel of claim 14, wherein the pad-adjacent straight line portion includes one of the following: the upper edge at which the display is located and the lower edge are both polished; only the lower edge is polished; and the upper edge and the lower edge are both not polished.

17. The display panel of claim 11, further comprising a thin film encapsulation layer covering the display unit, the thin film encapsulation layer comprising at least one organic film and at least one inorganic film.

18. The display panel of claim 11, wherein the display unit comprises a thin film transistor and a light-emitting device.

19. A method of manufacturing a display panel, the method comprising:

forming a unit panel in which a display unit is provided on a substrate, the substrate comprising glass;

cutting out the substrate of the unit panel in a form of a closed loop in a plan view, the closed loop having a straight line portion and a curve portion that is connected to the straight line portion, simultaneously polishing a first amount of the curve portion of an upper edge having the display thereon and a lower edge opposite to the upper edge by a first polishing process using a first polishing tool, polishing a second amount of the straight portion of an upper edge and a lower edge opposite to the upper edge by a second polishing process using a second polishing tool, wherein the first amount is larger than the second amount and a step is formed at a boundary at which the curve portion is connected to the straight line portion.

* * * * *